United States Patent
Nagle et al.

(10) Patent No.: US 7,245,183 B2
(45) Date of Patent: Jul. 17, 2007

(54) APPARATUS, METHODS AND ARTICLES OF MANUFACTURE FOR PROCESSING AN ELECTROMAGNETIC WAVE

(75) Inventors: Pierce Joseph Nagle, Cork (IE); Andrei Grebennikov, Cork (IE); Frank Sharpe, Cork (IE); Gerard Quilligan, Limerick (IE)

(73) Assignee: M/A-Com Eurotec BV, Amsterdam (NL)

( * ) Notice: Subject to any disclaimer, the term of this patent is extended or adjusted under 35 U.S.C. 154(b) by 292 days.

(21) Appl. No.: 10/396,251

(22) Filed: Mar. 25, 2003

(65) Prior Publication Data

US 2004/0189395 A1 Sep. 30, 2004
US 2007/0103236 A9 May 10, 2007

Related U.S. Application Data

(63) Continuation-in-part of application No. 10/294,430, filed on Nov. 14, 2002, now Pat. No. 6,891,432.

(51) Int. Cl.
   *H03F 3/68* (2006.01)

(52) U.S. Cl. .................. 330/295; 330/124 R; 330/296

(58) Field of Classification Search .................. None
   See application file for complete search history.

(56) References Cited

U.S. PATENT DOCUMENTS

| | | | |
|---|---|---|---|
| 3,480,881 A | 11/1969 | Boykin | 332/9 |
| 3,978,422 A | 8/1976 | Rheinfelder | |
| 4,580,111 A | 4/1986 | Swanson | |
| 4,586,000 A | 4/1986 | Wagner | |
| 4,646,359 A | 2/1987 | Furrer | |
| 4,804,931 A | 2/1989 | Hulick | 332/31 R |
| 4,947,455 A | 8/1990 | Swanson | 455/115 |
| 4,952,890 A | 8/1990 | Swanson | 332/152 |
| 5,268,658 A | 12/1993 | Edwards | 332/151 |
| 5,278,997 A | 1/1994 | Martin | |
| 5,311,143 A | 5/1994 | Soliday | |
| 5,367,272 A | 11/1994 | Hulick | 332/149 |
| 5,392,007 A | 2/1995 | Cripe | 332/149 |
| 5,410,280 A | 4/1995 | Linguet et al. | |
| 5,450,044 A | 9/1995 | Hulick | 332/103 |
| 5,469,127 A | 11/1995 | Hulick et al. | 332/149 |
| 5,621,351 A | 4/1997 | Puri et al. | 330/10 |
| 5,642,002 A | 6/1997 | Mekanik et al. | |
| 5,774,017 A | 6/1998 | Adar | |
| 5,818,298 A | 10/1998 | Dent et al. | |

(Continued)

FOREIGN PATENT DOCUMENTS

DE 1953755 5/1970

(Continued)

OTHER PUBLICATIONS

Hulick, "The Digital Linear Amplifier", Schwenksville, Pennsylvania.

(Continued)

*Primary Examiner*—Khanh Van Nguyen

(57) ABSTRACT

A method of processing an electromagnetic wave comprises regulating at least two independently controllable current sources with a signal determined from at least one characteristic of the electromagnetic wave to generate a processed electromagnetic wave from at least one of the independently controllable current sources.

29 Claims, 6 Drawing Sheets

U.S. PATENT DOCUMENTS

| | | | |
|---|---|---|---|
| 5,867,071 A | 2/1999 | Chethik | 332/103 |
| 5,880,633 A | 3/1999 | Leizerovich et al. | |
| 5,886,573 A | 3/1999 | Kolanek | 350/10 |
| 5,892,431 A | 4/1999 | Osterman | |
| 5,903,854 A * | 5/1999 | Abe et al. | 330/124 R |
| 5,930,128 A | 7/1999 | Dent | |
| 5,939,951 A | 8/1999 | Bateman et al. | |
| 5,942,946 A | 8/1999 | Su et al. | |
| 5,952,895 A | 9/1999 | McCune, Jr. et al. | |
| 6,041,082 A | 3/2000 | Takeda et al. | 375/300 |
| 6,043,707 A | 3/2000 | Budnik | |
| 6,043,712 A | 3/2000 | Leizerovich et al. | |
| 6,075,413 A | 6/2000 | Katakura | |
| 6,078,628 A | 6/2000 | Griffith et al. | |
| 6,094,101 A | 7/2000 | Sander et al. | |
| 6,097,252 A | 8/2000 | Sigmon et al. | |
| 6,101,224 A | 8/2000 | Lindoff et al. | |
| 6,112,071 A | 8/2000 | McCune, Jr. | |
| 6,130,910 A | 10/2000 | Anderson et al. | 375/238 |
| 6,133,788 A | 10/2000 | Dent | |
| 6,140,875 A | 10/2000 | Van Den Homberg et al. | |
| 6,140,882 A | 10/2000 | Sander | |
| 6,147,553 A | 11/2000 | Kolanek | |
| 6,157,681 A | 12/2000 | Daniel et al. | |
| 6,191,653 B1 | 2/2001 | Camp, Jr. et al. | |
| 6,198,347 B1 | 3/2001 | Sander et al. | |
| 6,201,452 B1 | 3/2001 | Dent et al. | |
| 6,215,355 B1 | 4/2001 | Meck et al. | |
| 6,219,394 B1 | 4/2001 | Sander | |
| 6,236,284 B1 | 5/2001 | Duello et al. | |
| 6,242,975 B1 | 6/2001 | Eidson et al. | |
| 6,246,286 B1 | 6/2001 | Persson | |
| 6,255,906 B1 | 7/2001 | Eidson et al. | |
| 6,259,901 B1 | 7/2001 | Shinomiya et al. | |
| 6,269,135 B1 | 7/2001 | Sander | |
| 6,285,251 B1 | 9/2001 | Dent et al. | |
| 6,288,916 B1 | 9/2001 | Liu et al. | |
| 6,294,957 B1 | 9/2001 | Luu | |
| 6,300,837 B1 | 10/2001 | Sowlati et al. | 330/296 |
| 6,311,046 B1 | 10/2001 | Dent | |
| 6,317,002 B1 * | 11/2001 | Griffiths | 330/295 |
| 6,317,608 B1 | 11/2001 | Glöcker | |
| 6,321,072 B1 | 11/2001 | Cipriani et al. | |
| 6,323,731 B1 | 11/2001 | McCune, Jr. | |
| 6,356,155 B1 | 3/2002 | Judkins | |
| 6,366,177 B1 | 4/2002 | McCune et al. | |
| 6,369,657 B2 | 4/2002 | Dening et al. | |
| 6,377,784 B2 | 4/2002 | McCune | |
| 6,380,802 B1 | 4/2002 | Pehike et al. | |
| 6,404,823 B1 | 6/2002 | Grange et al. | |
| 6,411,655 B1 | 6/2002 | Holden et al. | |
| 6,426,677 B1 | 7/2002 | Prentice | |
| 6,426,678 B1 | 7/2002 | Ko | |
| 6,430,402 B1 | 8/2002 | Agahi-Kesheh | |
| 6,441,687 B1 * | 8/2002 | Apel | 330/295 |
| 6,445,247 B1 | 9/2002 | Walker | |
| 6,448,859 B2 * | 9/2002 | Morizuka | 330/295 |
| 6,449,465 B1 | 9/2002 | Gailus et al. | |
| 6,636,112 B1 | 10/2003 | McCune | 330/10 |
| 6,658,238 B1 | 12/2003 | Ursenbach et al. | 455/102 |
| 6,661,290 B2 * | 12/2003 | Sugiura | 330/295 |
| 6,738,432 B2 | 5/2004 | Pehlke et al. | 375/300 |
| 6,791,417 B2 | 9/2004 | Pengelly et al. | 330/295 |
| 6,799,020 B1 | 9/2004 | Heidmann et al. | 455/103 |
| 6,816,008 B2 | 11/2004 | Kontson | 330/51 |
| 6,891,432 B2 * | 5/2005 | Nagle et al. | 330/124 R |
| 2005/0030104 A1 | 2/2005 | Chen et al. | 330/295 |

FOREIGN PATENT DOCUMENTS

| | | |
|---|---|---|
| EP | 0 693 843 A1 | 1/1996 |
| EP | 0 803 986 A1 | 10/1997 |
| EP | 1096670 A2 | 5/2001 |
| WO | WO 01/10013 A1 | 2/2001 |
| WO | WO 02/03544 A1 | 1/2002 |

OTHER PUBLICATIONS

Kozyrey, "Single-Ended Switching-Mode Tuned Power Amplifier with Filtering Circuit", Poluprovodnikovye pribory v tekhnike svyazi, 1971, pp. 152-166, vol. 6.

TimeStar™, "Multi-Mode Polar Modulator" 2002, Tropian Headquarters, USA.

Sundstrom, "Digital RF Power Amplifier Linearisers", 1995, Sweden.

Kenington, "Linearised RF Amplifier and Transmitter Techniques", Microwave Engineering Europe, Nov. 1998, pp. 35-.

Mann, et al., "Increasing Talk-Time with Effecient Linear PAs", Presented at IEE Colloquim on Tetra Market and Technology Developments, Feb. 2000, London.

Mann, et al., "Increasing the Talk-Time of Mobile Radios with Effecient Linear Transmitter Architectures", Electronics & Communication Engineering Journal, Apr. 2001, pp. 65-76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, pp. 131-133, vol. 35, No. 2.

Tropian-Products Main, www.tropian.com/products/, Copyright 2000-2001, Aug. 14, 2002.

"Tropian and Agilent Technologies announce collaboration on multi-band, multi-mode 2.5G transmitter solutions", Feb. 18, 2002, Connes, France.

"Tropian Awarded 8th U.S. Patent for Wireless Technology: Innovative RF Power Processing Circuit Architecture Achieves Speed and Accuracy in Polar Modulation,"Aug. 6, 2001, Cupertino, California.

Dialog Web Command Mode, p. 1 of 1, Sep. 17, 2002, Record 03929207, Polar Modulators for 1 and 2 GHz Power Amplifier Correction, NISBET, J.

Dialog Web Command Mode, p. 1 of 1, Sep. 17, 2002, Record 0326082, A new Class-AB Design, DE Jager, et al., Electronics World 105, Dec. 1999, p. 982-7.

Dialog Web Command Mode, p. 1 of 1, Sep. 17, 2002, Record 2371235; Increasing the talk-time of mobile radios with efficient linear transmitter architectures, MANN et al., Electronics & Communication Engineering Journal, v. 13, No. 2, Apr. 2001 (p. 65-76).

Dialog Web Command Mode, p. 1 of 3, Sep. 17, 2002, Record 15595216, The big climate amplifier ocean circulation-sea-ice-storminess-dustiness-albedo, Broecker, Geophysical Monograph, 2001, 126, 53-56, etc.

Dialog Web Command Mode, p. 1 of 9, Sep. 19, 2002, Record 10872787, Out-of-band emissions of digital transmissions using Kahn EER technique, Rudolph, IEEE Transactions on Microwave Theory & Techniques, 2002, V 50, N 8, Aug, p. 1979-1983, etc.

Dialog Web Command Mode, p. 1 of 20, Sep. 17, 2002. Record 01239474, GSM players Eye Edge Despite Transmit Woes, Keenan, Electronic Engineering Times, 2002, n 1211, p. 6.

Kahn, L R: "Single-Sideband Transmission By Envelope Elimination and Restoration" Proceedings Of the Institute Of Radio Engineers, IEEE Inc., New York, US, Jul. 1952, pp. 803-806, XP000990633.

* cited by examiner

APPARATUS, METHODS AND ARTICLES OF MANUFACTURE FOR PROCESSING AN ELECTROMAGNETIC WAVE

CROSS-REFERENCE TO RELATED APPLICATIONS

This application is a Continuation-In-Part of U.S. patent application Ser. No. 10/294,430, now U.S. Pat. No. 6,891,432.

FIELD OF THE INVENTION

The invention relates generally to electromagnetic, and more particularly to the attenuation or amplification of electromagnetic waves.

BACKGROUND OF THE INVENTION

The controlled attenuation or amplification of electromagnetic waves has many uses. For example, intelligence may be conveyed along a wave by attenuating and/or amplifying ("modifying") electromagnetic wave characteristics, such as is seen when modulating amplitude, frequency or phase of an electrical current or radio frequency (RF) wave to transmit data. As another example, power may be conveyed along a wave in a controlled fashion by attenuating and/or amplifying electromagnetic wave characteristics, such as is seen when modulating voltage or current in a circuit. Moreover, the uses may be combined, such as when intelligence may be conveyed through a wave by modifying power characteristics.

Electromagnetic wave characteristic modification may be accomplished through digital or analog techniques. For instance, a wave may be switched off, and thus the wave attenuated completely; the voltage of a wave may be increased, such as by a factor of 1.5, and thus the wave regulated; etc. Digital and analog attenuation and/or amplification may also be combined, that is, the same wave may be subject to various types of digital and/or analog attenuation and/or amplification within a system in order to accomplish desired tasks.

Electromagnetic waves have, until fairly recently, been modified using analog techniques, and there had been no attempt to isolate discrete wave characteristics such as current, voltage and the like and modify those characteristics in order to modify the wave itself. Recently, however, wave modification techniques have become digitized, so that characteristics of the wave can be isolated and modified directly in order to achieve a desired result. Digitization has become desirable because it usually provides increased precision and flexibility in wave modification while consuming less power than previous methods.

Using digitization to process electromagnetic wave, such as in the amplification of a wave, has provided improved linearity of the processed wave, while at the same time also improving the efficiency of the process by reducing power consumption. Digitization also allows for the reduction of noise in the processed wave through the use of digital based techniques that are not available in analog processing systems.

Accordingly, it would be helpful to the art of electromagnetic wave modification if apparatus, methods, and articles of manufacture were provided that utilize digital techniques in the processing of electromagnetic waves.

SUMMARY OF THE INVENTION

Embodiments of the present invention include apparatus, methods and articles of manufacture for generating and/or modifying electromagnetic waves. In one embodiment, a method of processing an electromagnetic wave comprises regulating at least two independently controllable current sources with a signal determined from at least one characteristic of the electromagnetic wave to generate a processed electromagnetic wave from at least one of the independently controllable current sources. In another embodiment, an electromagnetic wave processor comprises a plurality of independently controllable current sources connected to use a signal determined from at least one characteristic of an electromagnetic wave. The signal is input to the plurality of independently controllable current sources to generate a processed electromagnetic wave from at least one of the independently controllable current sources.

DETAILED DESCRIPTION

Embodiments of the invention include apparatus, methods and articles of manufacture for wave or signal processing. The term "signal" as used herein should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, voice, text and/or video, etc.

Figure 1:
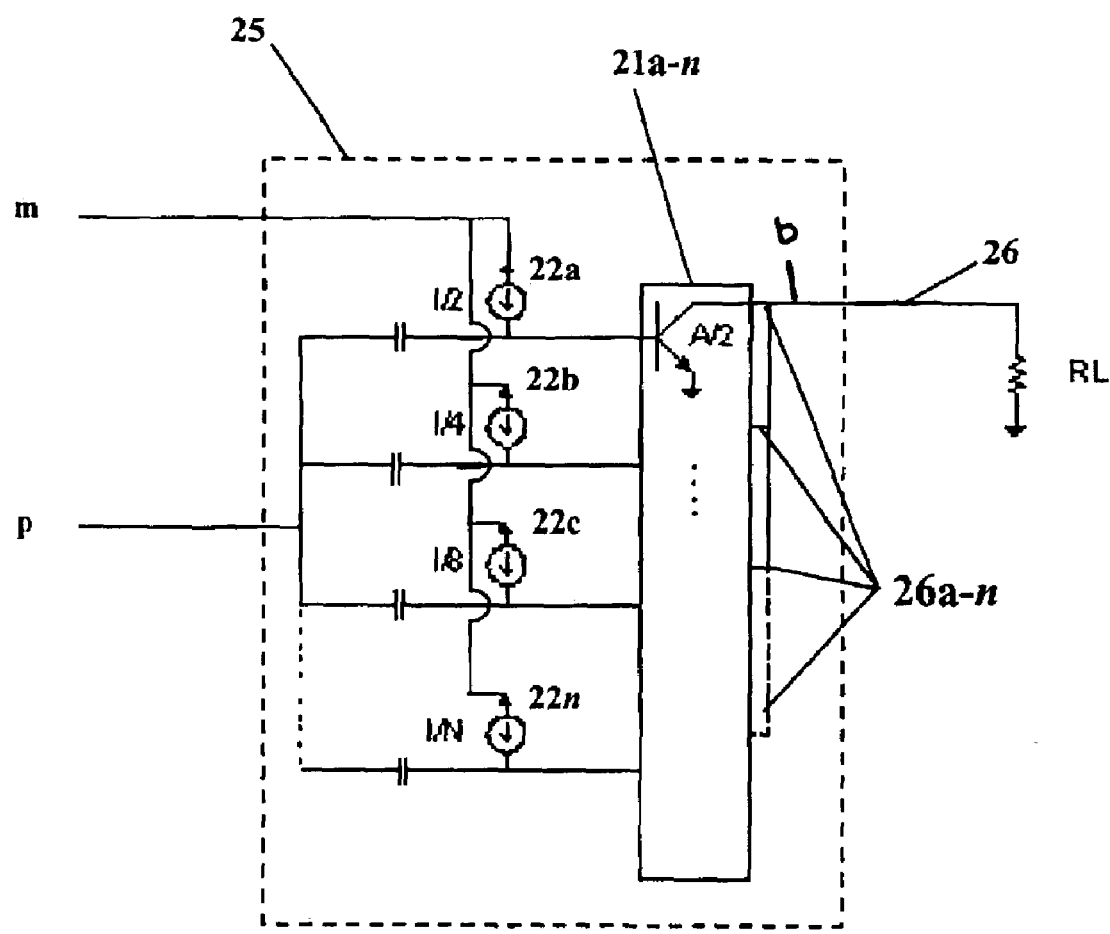
FIG. 1 is a diagram illustrating an embodiment of a wave processor.

In an exemplary embodiment, a wave may be divided into two component characteristics. This wave may be an input wave, for example, to an electromagnetic signal transmitter, receiver, or transceiver. As shown in FIG. 1, the input wave may be divided into a magnitude component m comprising magnitude characteristics of the input wave over a defined period and a phase component p, comprising phase characteristics of the input wave over the same period.

The manner in which the input wave is divided is not particularly limited. One exemplary manner in which this may be accomplished is to provide input wave a to a digital signal processor, which digitizes the wave, such as by the use of rectangular coordinates or I,Q data. A rectangular to polar converter then receives the I,Q data and translates it into polar coordinates.

It should be noted that, in other embodiments, a different digitized representation of a wave may be provided if desired. While the invention is described herein in connection with an embodiment using a digitized wave with polar data, those of ordinary skill in the art will appreciate that the invention is not limited thereto and may use any digital or analog waveform, or combination thereof.

An output wave b is shown after processing by a preferred embodiment. It should be noted that the time period in this and other embodiments is as desired. For example, embodiments may derive magnitude and phase characteristics of the wave over various time periods in order to maximize resolution of the wave, maximize speed of operation, etc. These time periods may be dynamically determined as well in various embodiments so that they change during operation. In the preferred embodiments, the division of the input wave is synchronized, in order to maximize accuracy of output and minimize any distortion.

FIG. 1 shows an exemplary embodiment of a wave processor. The amplitude characteristics of the original input wave may be modulated along path m into digital pulses comprising a digital word quantized into bits Bl to Bn, with a Most Significant Bit ("MSB") to Least Significant Bit ("LSB"). It should be noted in FIG. 2 that, for ease of viewing the figure, the control component lines are consolidated into a single path m leading into control components 22a–n. However, in the embodiment, and as further described below, the control component lines are not consolidated and instead feed into the control components individually. The digital word may be as of varying lengths in various embodiments. In general, the longer the word the greater the accuracy of reproduction ("resolution") of the input wave. The digital word provides instruction signals for processing of the wave, such as for attenuation and/or amplification, in manner to be described further below. Of course, as is described further below, in other embodiments, a differently composed digital word may be used, as well as other types of derivation of amplitude or other wave characteristics.

The phase characteristic component of input wave a travels along path p, where it is modulated onto a carrier wave, preferably an RF signal. This wave preferably has a constant envelope, i.e., it has no amplitude variations, yet it has phase characteristic information of the original input wave, and passes to wave processor 25. The wave, which has been split among individual driver lines, is then fed into current sources 21a–n, and will serve to potentially drive current sources 21a–n, as is further described below. In other embodiments, as further described below, other sources of other wave characteristics may be used.

It should be noted that, in the present embodiment, transistors maybe used as current sources 21a–n. Additionally, in other embodiments, one or more transistors segmented appropriately may be used as current sources 21a–n. The current sources 21a–n in one preferred embodiment must not be configured to behave like voltage sources, which will interfere with the desired current combining of the sources.

Path m (comprised of control component lines m1–mn as described above) terminates in control components 22a–n. In a preferred embodiment, these are switching transistors, and are preferably current sources, although, as further described below, in other embodiments, other sources of other wave characteristics may be used, as well as other regulation schemes. Control components 22a–g are switched by bits of the digital word output from the amplitude component and so regulated by the digital word output from the amplitude component. If the digital control word is a binary signal and an individual bit is "1" or "high," the corresponding control component may be switched "on", and so current flows from that control component to appropriate current source 21a–n. As had been noted above, the length of the digital word may vary, and so the number of bits, control components, control component lines, driver lines, bias control lines, current sources, etc. may vary accordingly in various embodiments. Moreover, there does not have to be a one to one correspondence among digital word resolution, components, lines and current sources in various embodiments.

Current sources 21a–n receive current from a control component if the control component is on, and thus each current source is regulated according to that component. In the especially preferred embodiments, an appropriate control component provides bias current to the current sources, as is described further below, and so the control component may be referred to as a bias control circuit, and a number of them as a bias network. In some embodiments, it may be desired to statically or dynamically allocate one or more bias control circuits to one or more current sources using a switching network if desired. For example, the circuitry of control components 22a–n may be configured to control a particular one or more of transistors of segments 21a–n.

Figure 2:
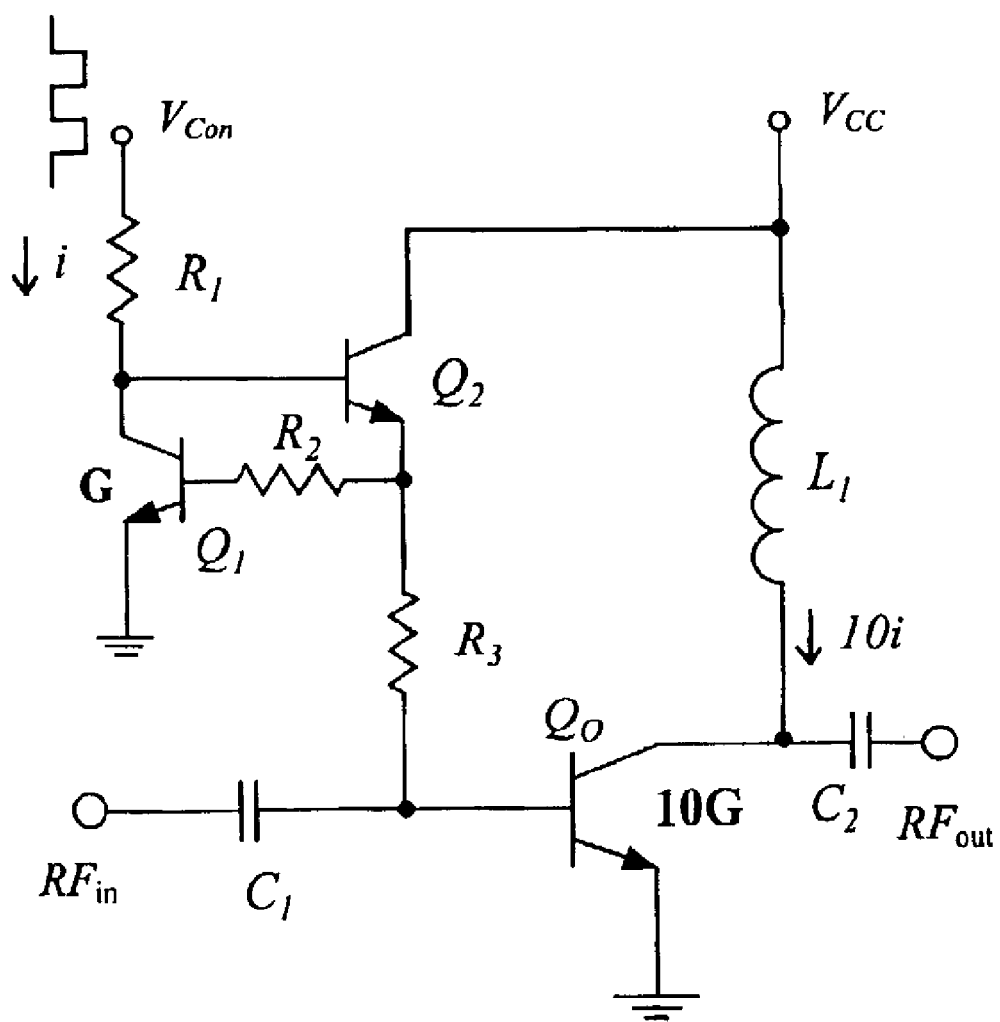
FIG. 2. is a diagram illustrating exemplary embodiments of a control circuit for a wave processor

An examples of an embodiment of a control circuit is illustrated in FIG. 2. It will be appreciated that while particular circuits and components are shown herein for purposes of explanation, the invention is not limited thereto. Different or additional components may be added and components may also be deleted.

FIG. 2 illustrates a bias circuit that incorporates one reference transistor. In this example, output transistor $Q_O$ may represent one of transistor segments 21a–n, which, when switched on, contributes a predetermined amount of output current ($RF_{out}$) to the output of wave processor 25. A plurality of control circuits and output transistors may be provided to contribute the aforementioned current outputs. In this embodiment, a biasing voltage for transistor $Q_1$ is varied in accordance with a respective control bit of the digital control word. As control voltage $V_{con}$ is varied, varying current i flows through resistor $R_1$ as determined by the gain G of transistor $Q_1$. Current i thus controls the flow of current through transistor $Q_2$.

The current from transistor $Q_2$ is used to control the predetermined current to be outputted from transistor $Q_O$. The phase portion of the input wave p is inputted at $RF_{in}$, where it may pass components such as capacitor $C_1$, which acts to block DC components from the signal. When the control bit is "on", current flows though the circuit and output transistor $Q_O$ contributes its output current to the output of wave processor 25. In this example, output transistor $Q_O$ has a gain that is ten times that of transistor $Q_1$, however, as should be understood, other values may be used as well. Output transistor $Q_O$ is biased by voltage $V_{cc}$. The current outputted from the collector of output transistor $Q_O$ is filtered by inductor $L_1$ and capacitor $C_2$, which act to provide filtering of the output signal $RF_{out}$.

Each of the outputs from each of the output transistor segments that are switched "on" in this manner contribute their respective currents to the output of wave processor 25, (while the transistors that are switched "off" do not), thus processing the input wave to form the output wave.

The digital control word of amplitude component m may be configured or coded in any desired manner for operating the above-described segments in any desired manner. By way of illustration, in one preferred embodiment the digital control word contains seven bits to represent a wave characteristic of the input wave a, such as amplitude. Each configuration of these seven bits represents a different input state to wave processor 25, where each input state may correspond to a digital representation of the wave characteristic.

Figure 3:
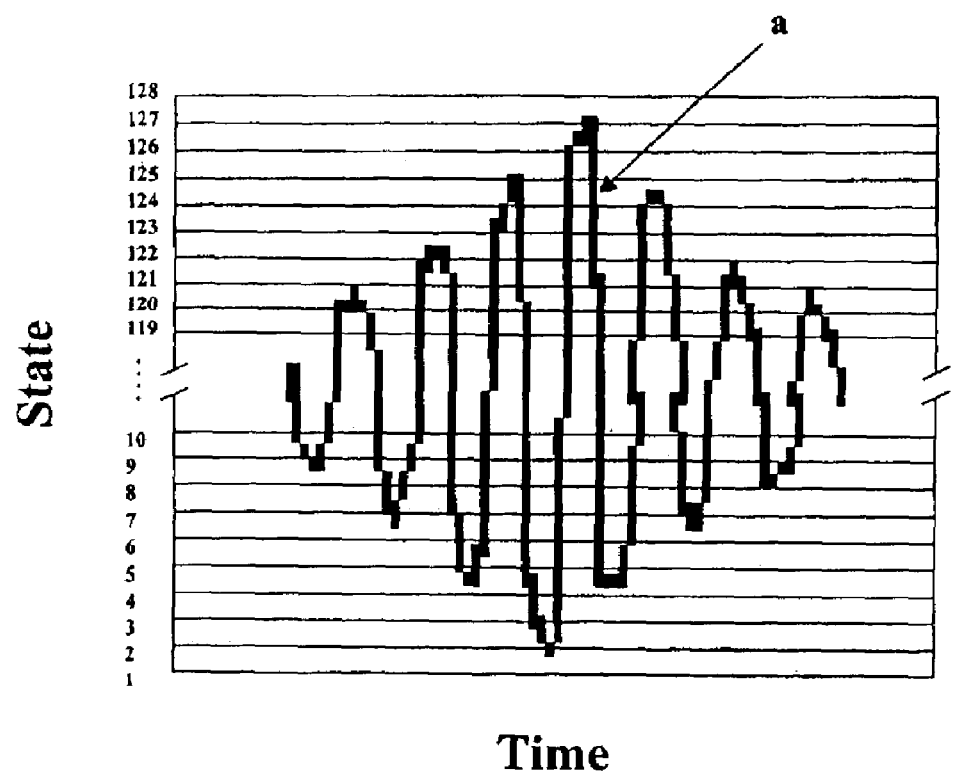
FIG. 3 is a chart illustrating states of a wave over time.

This is further illustrated in FIG. 3 for this example. If the control bits are configured in a binary system, then seven control bits may be configured in $2^7$ or 128 different ways, allowing for 128 different input states to wave processor 25. Each of these 128 states may represent, for example, a discrete amplitude level or range of an input wave a. As can be seen from FIG. 3, the greater the number of control bits, the greater the number of input states, and hence the greater the resolution of the wave processor.

The coding system that may be employed in accordance with the embodiments disclosed herein is not limited and may include any digital representation of a characteristic of an input wave a that may be used to control wave processor 25 in any manner. In an especially preferred embodiment, the digital representation is of the amplitude of the input wave and comprises a binary digital word having seven bits, where each bit, from the most significant bit ("MSB") to the least significant bit ("LSB") is used to control a designated segment or segments of wave processor 25 to generate an output current.

In this preferred embodiment, each bit (1,2,4,8,16,32, and 64) represents the number 2 raised to a power (0,1,2,3,4,5,6) and one or more of these bits are combined to designate a number corresponding to the wave characteristic of input wave a, such as amplitude. If a bit is switched high or "on" ("1"), it is counted; if it is switched low or "off" ("0"), it is not counted. Thus, for example, if the digital word represents the number "63", then the bit representing the number 64 would be off (or "0") and the bits for 32, 16, 8, 4, 2, and 1 would be on ("0111111"). Adding the designated bits together equals 63 (32+16+8+4+2+1=63). If the digital word represents the number "64", then only the bit representing the number 64 would be on, and the others would be off ("1000000").

Each segment of wave processor 25 receives current from one or more of the control components based upon these control bits and may be biased to serve as a potential current source. The segment may or may not act as a current source, because it is regulated via the appropriate digital word value regulating the control component, and activation of a segment is dependant upon the value of the appropriate bit from the digital representation of the amplitude component, and concomitant regulation of the appropriate control component.

In one embodiment, the segments are varied in size such that the first segment a is twice the size of the next segment b, which in turn is twice the size of the next segment c, and so on until reaching the final segment n. The largest segment a is controlled by the MSB of the amplitude word, the next bit of the word to the next largest segment, etc., until the LSB, which is sent to the smallest segment. Alternatively, the segments may be sized and grouped so that a particular group of segments may represent a particular bit of the control word. Of course, as noted above, other embodiments may have a different pattern of matching bit to segment. In other embodiments, other wave characteristics may be fed to another source of wave characteristics and so regulate that source.

As the digital control word changes over time, one or more of segments may become a current source, contributing a corresponding amount of current to the output of wave processor 25. The current output from each segment is thus combined at the output of wave processor 25 to drive load $R_L$. The current is outputted from wave processor 25 in relation to the input state of the wave processor as designated by the digital control. The input state changes as the digital control word changes, which, in turn, changes the segments that contribute current to the output, thus processing the input wave in the determined manner, e.g., amplification.

Figure 4:
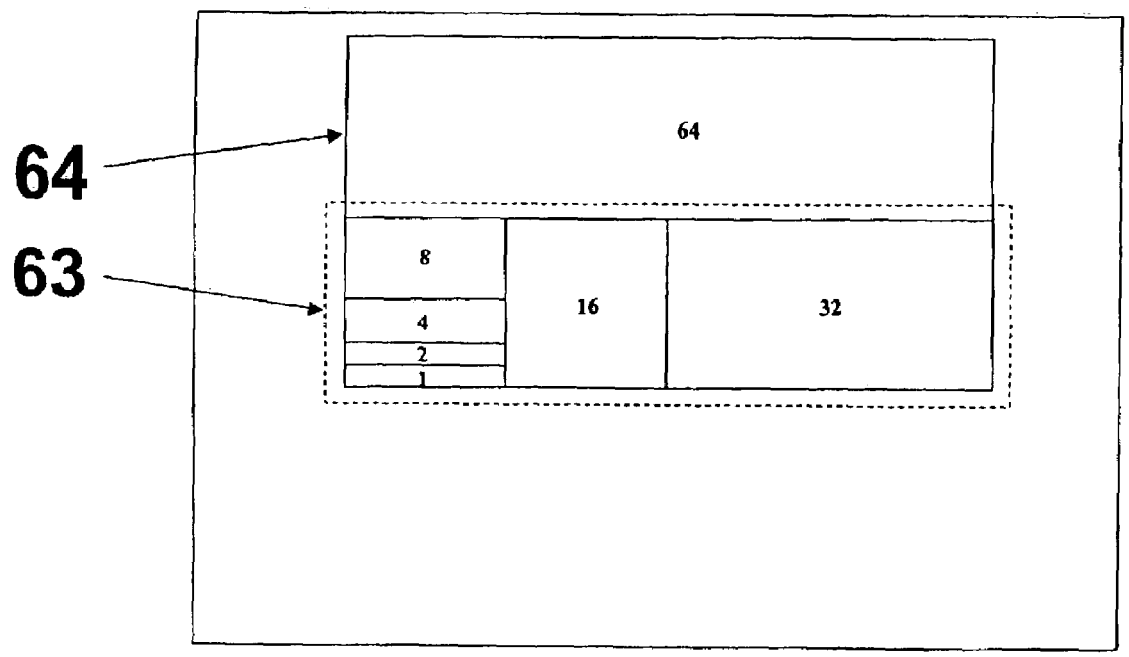
FIGS. 4 (a)–(c) are diagrams illustrating the operation of embodiments of a segmented wave processor.
Figure 4:
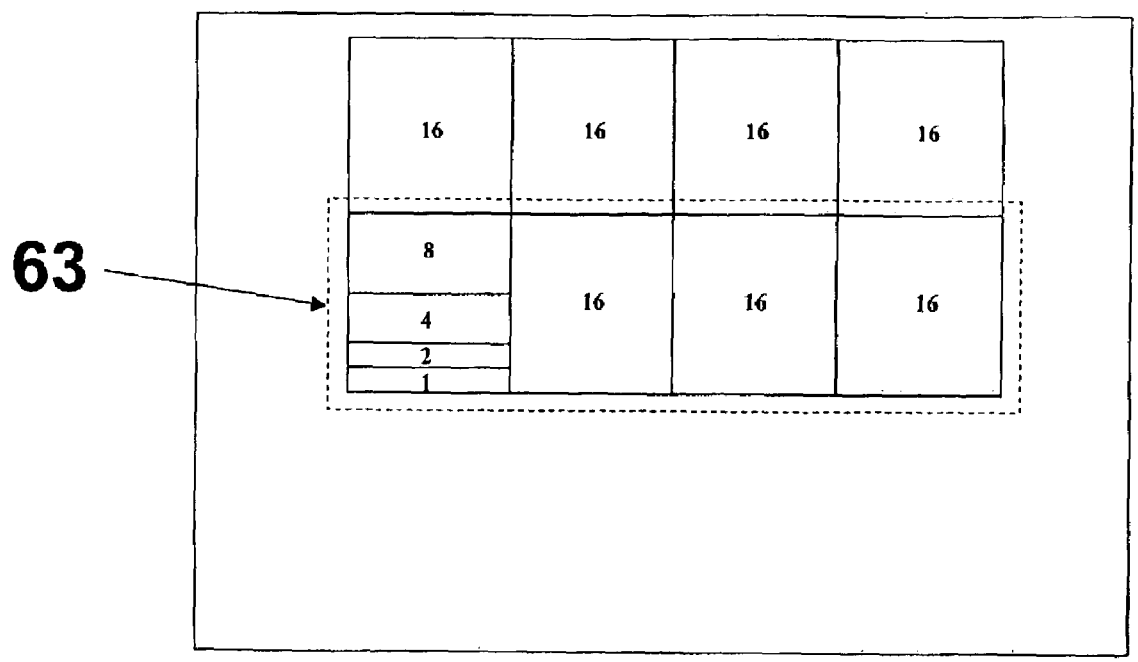
Figure 4:
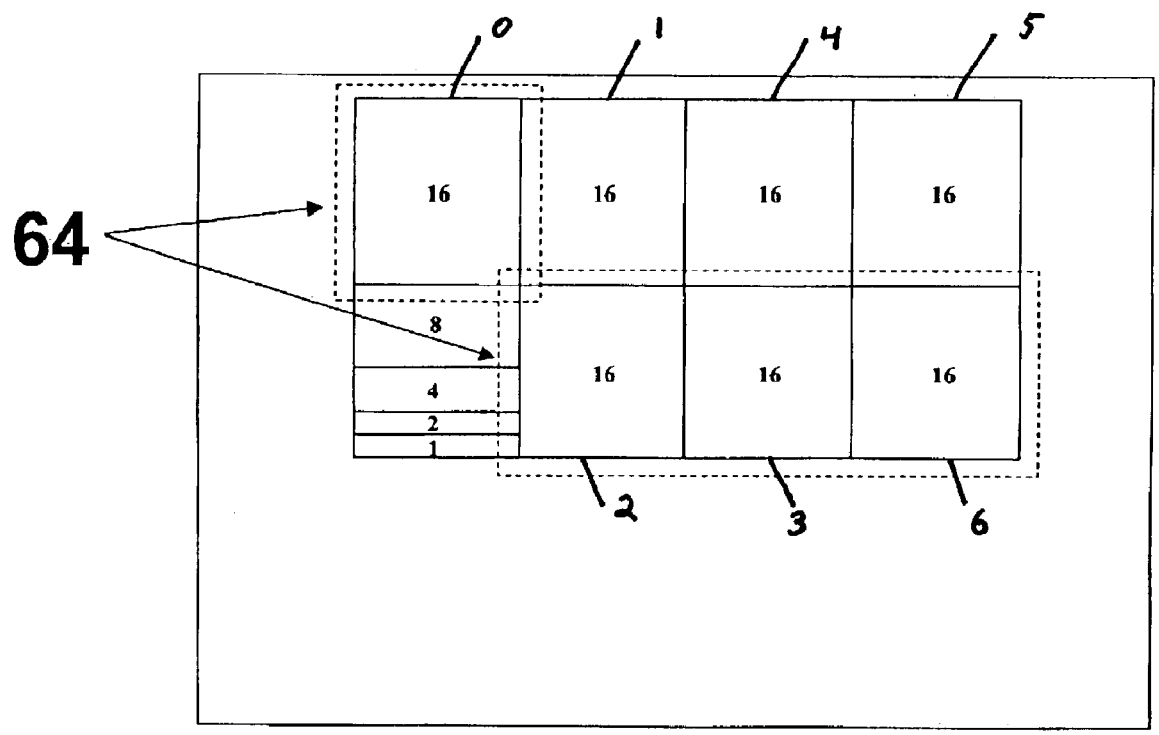

The foregoing is further illustrated by FIGS. 4(*a*)–(*c*), which comprise exemplary IC layouts. In these examples, each segment, or group of segments, may represent a number corresponding to an input state. For example, as shown in FIG. 4(*a*), seven segments may be used to each represent a number corresponding to the significance of one of the seven bits of the digital control word, i.e., 64, 32, 16, 8, 4, 2, and 1. Each segment may be sized or weighted in this example to contribute a proportionate amount of current to the output when acting as a current source. For example, a segment representing the number "64" may contribute twice as much current as a segment representing the number "32". When the digital word inputted to the wave processor designates a particular input state, the control components switch on segments that combine to designate that state. For the example shown in FIG. 4(*a*), if the input state is "63", then segments 1, 2, 4, 8, 16, and 32 are turned on to contribute current and the segment representing 64 is turned off. When the digital word, and thus the input state, changes (for example, to "64"), then the control components switch off segments 1, 2, 4, 8, 16, and 32, and switch on the segment representing 64.

Alternatively, as shown in FIG. 4(*b*), some of the segments may be evenly weighted, but more than one segment may be grouped to designate a number for the input state. In this example, eleven segments may be used to represent the seven bits of the digital control word. Seven of the segments each represent the number 16, while the remaining segments represent the numbers 8, 4, 2, and 1. Four of these segments may thus be combined to represent the number 64, two may be combined to represent the number 32, etc.

Weighting the segments in this manner allows for the segments to be combined in a variety of ways to achieve the desired state. Thus, as shown in FIG. 4(*c*), in switching from state "63" to state "64", the four smaller segments (8, 4, 2, 1) may be switched off and only one 16 segment need be switched on to achieve the desired change in state. The use of smaller segments is advantageous, for example, when switching transistors, because it may reduce switching noise and glitching that may occur in the processed signal due to inherently larger capacitance of the larger transistors.

In addition, the sequence by which segments are switched off or on in order to achieve a particular change in state may be regulated where desired. For example, in some embodiments, a particular sequence may be selected based upon certain factors, such as environmental factors, including, for instance, temperature gradients and/or other non-linearities in a fabricated chip, etc. Moreover, a particular sequence may be chosen at any desired time period, and a particular sequence may be further re-sequenced one or more times at any later point where ever that may be deemed appropriate. One exemplary sequence is illustrated in FIG. 4(*c*). In this embodiment, the seven segments representing the number 16 are labeled, beginning with the segment on the upper left hand corner and moving clockwise, as 0, 1, 4, 5, 6, 3, 2. As shown in FIG. 4(*c*), the order of the sequence as to when each of these seven segments are switched on comprises segment 3 first, segment 4 second, segment 5 third, segment 6 fourth, segment 2 fifth, segment 1 sixth and segment 0 seventh. Of course, it should be understood that any other particular sequence may be utilized where desired.

Returning now to the embodiment of FIG. 1, each of the components serves as a potential current source, and is capable of generating a current, which is output to current source lines 21a–n respectively. It should be noted that the current sources are not an amplifier or amplifiers, in the preferred embodiments, rather the plurality of current sources function as an amplifier, as is described herein. Indeed, amplification and/or attenuation may be considered in the preferred embodiments as functions of those embodiments, and so may an amplifier and/or attenuator be considered to be an electrical component or system that amplifies and/or attenuates.

The combined current, i.e. the sum of any current output from current sources 21a–n, is the current sources output. Thus, an embodiment may act as an attenuator and/or amplifier. In preferred embodiments, no further circuitry or components are necessary between current sources to combine current from each current source and so provide a useful output current. Therefore, the combined current, which is output on line 26, may be used as desired, e.g., as an amplifier, as an attentuator, to drive a load, etc.

It should be noted that, in the invention, the current sources are biased non-linearly. Thus, any current source operates efficiently. In the preferred embodiments, therefore, power consumption is reduced. Additionally, as a result of current source regulation according to signal characteristics, as had been described above, the resultant output signal has a relatively accurate linearity and proportionality with the input signal. Thus, an amplifier may be provided in the preferred embodiments with the relative precision of linear operation combined with the relative efficiency and power consumption of non-linear operation.

For example, returning to the embodiment of FIG. 1, if one of current sources 21a–n is switched on, it will act as a non-linear current source with attendant relative efficiency. If the current source is off, the source consumes little or no power. Linear characteristics are seen as well because each current source that is on provides current contribution in similar proportions to the amplitude characteristic of the input signal, and so a relatively precise reproduction of the input signal is provided.

The current sources 21a–n may comprise, in the preferred embodiment of FIG. 1, one or more HBT transistors. Other transistors may be used as well, such as FETs, etc., as well as other current sources. Other components may be interposed as well, e.g., a variable gain amplifier or attenuator to reduce the drive current to the transistor segments, non-linear components along the amplitude path, etc.

The use of the preferred embodiments may provide a capability for wide band amplitude modification in an associated transmitter because it makes possible linear amplification and/or attenuation across a relatively large frequency spectrum, due to the relatively low input capacitance. Thus, embodiments may be used for cellular and other transmitters, as is described further herein.

Advantageously, embodiments of the present invention may improve efficiency over conventional power amplification, because linearity of the transmission is not dependent on the linearity of the amplifier, but instead depends only on how linearly the currents add to the load. Accordingly, each current source can be biased as a non-linear current source, such as Class B or C, to maximize the efficiency. Efficiency may further be improved because there is little or no quiescent current draw for disabled current sources.

In the illustrated embodiments, power control may readily be achieved because the output current is dependent primarily on the signal drive level. Increasing or decreasing the signal drive level, for example, with a variable gain amplifier or attenuator, causes a corresponding increase or decrease in the output current. In addition, an increase or decrease of the bias to the drive controller, also causes a respective increase or decrease in the output current.

As should be understood, any suitable types of current sources, for example, other transistor segments and/or formats, as well as other devices or methods, may be used with any of the embodiments of the present invention where desired.

In, embodiments fabricated as a single integrated circuit, weighting may be achieved by providing segments having different semiconductor areas. For example, when the area of a segment is reduced in size by half, the current supplied by the segment to the load is also reduced in half. This is because the smaller segment has half the current density of the larger segment.

Amplifiers according to embodiments of the invention can provide a direct digital interface for baseband DSP functions. The amplifiers also may be dynamically programmed to accommodate multiple modulation formats and wireless network standards. An advantage is that cost and size of devices using an amplifier based on this aspect of the invention can be reduced. Furthermore, the output current combines into the load to develop a voltage that can be an analog representation of the amplitude characteristic, so that the amplifier also performs a digital-to-analog conversion.

Various types of system architectures may be utilized for constructing the embodiments of the present invention. One of ordinary skill in the art will accordingly appreciate that embodiments of the invention or various components and/or features thereof may be entirely comprised of hardware, software or may be a combination of software and hardware. The embodiments or various components may also be provided on a semiconductor device where desired, such as an integrated circuit or an application-specific integrated circuit composition; some examples include silicon (Si), silicon germanium (SiGe) or gallium arsenide (GaAs) substrates.

Various embodiments may modify various parameters without departing from the spirit and scope of the present invention. For example, the length of the digital word may be longer or shorter in various embodiments, which may provide a more or less precise digitization of the wave. As other examples, as was described further above, the number of bits, control components, control component lines, driver lines, bias control lines, current sources, etc., may all be varied as desired.

While the invention has been described by illustrative embodiments, additional advantages and modifications will occur to those skilled in the art. Therefore, the invention in its broader aspects is not limited to specific details shown and described herein. Modifications, for example, may be made without departing from the spirit and scope of the invention. In addition, preferred embodiments may include amplifiers that are specialized for particular input signals, carrier waves and output signals e.g. embodiments may be used in various RF, microprocessor, microcontroller and/or computer devices, e.g. cell phones, such as CDMA, CDMA2000, W-CDMA, GSM, TDMA, as well as other wired and wireless devices, e.g. Bluetooth, 802.11a, -b, -g,, radar, 1xRTT, two-way radios, GPRS, computers and computer communication devices, PDA's and other handheld devices, etc. Accordingly, it is intended that the invention not be limited to the specific illustrative embodiments, but be interpreted within the full spirit and scope of the appended claims and their equivalents.

What is claimed is:

1. A method of processing an electromagnetic wave comprising the steps of: regulating a plurality of independently controllable current sources by a signal so that each of the plurality of independently controllable current sources are either off or on, wherein each one of the independently controllable current sources generates an output when on, with each of the outputs being combined to provide a processed electromagnetic wave, and wherein said independently controllable current sources are regulated by one or more control components configured to control the one or more of said independently controllable current sources based upon said signal, said signal comprising a digital word of a predetermined number of bits comprising a "1" or "0", a "1" bit switching on said one or more control components.

2. The method of claim 1, wherein said one or more control component controls current to said one or more independently controllable current sources, wherein current is input to said one or more independently controllable current sources when said one or more control components is switched on.

3. The method of claim 1, wherein a plurality of control components comprise a bias control network configured to control biasing said independently controllable current sources.

4. A method of processing an electromagnetic wave comprising the steps of: regulating a plurality of independently controllable current sources by a signal so that each of the plurality of independently controllable current sources are either off or on, wherein said signal has a plurality of signal components and wherein one or more of said independently controllable current sources is associated with a component in said signal, wherein each one of the independently controllable current sources generates an output when on, with each of the outputs being combined to provide a processed electromagnetic wave, and wherein the plurality of independently controllable current sources are switched on or off in a sequence regulated by a coded digital word.

5. The method of claim 4, wherein said signal has a plurality of signal components and wherein each of said independently controllable current sources represents a component of said signal and provides an output current corresponding to said component.

6. The method of claim 4, wherein said signal has a plurality of signal components and wherein a plurality of said independently controllable current sources together represents a component of said signal and provides an output current corresponding to said component.

7. The method of claim 4, wherein said independently controllable current sources are configured so that the fewest number of said independently controllable current sources will change when said signal changes.

8. The method of claim 4, wherein said signal is a digital signal.

9. The method of claim 4, wherein said signal is a binary number.

10. The method of claim 4, wherein said signal is a seven bit binary number.

11. The method of claim 4, wherein said independently controllable current sources comprise one or more transistors.

12. The method of claim 4, wherein each of the plurality of independently controllable current sources are weighted a predetermined magnitude and generate a particular output based on the weight.

13. The method of claim 4 wherein said signal has a plurality of signal components and wherein one or more of said independent current sources is associated with an amplitude component for said signal and one or more of said independent current sources is associated with a phase component for said signal.

14. An electromagnetic wave processor comprising:
a plurality of independently controllable current sources operatively connected for receiving a signal, with said independently controllable current sources being on or off in response to said signal, wherein said signal has a plurality of signal components and wherein one or more of said independently controllable current sources is associated with a component in said signal, wherein each one of the independently controllable current sources generates an output when on, and with each of the outputs being combined to provide a processed electromagnetic wave, and wherein the plurality of independently controllable current sources are switched on or off in a sequence regulated by a coded digital word.

15. An integrated circuit of claim 14, wherein each of the plurality of independently controllable current sources comprises at least one of a transistor or a transistor segment.

16. The electromagnetic wave processor of claim 14, wherein said signal has a plurality of signal components and wherein each of said independently controllable current sources represents a component of said signal and provides an output current corresponding to said component.

17. The electromagnetic wave processor of claim 14, wherein said signal has a plurality of signal components and wherein a plurality of said independently controllable current sources together represents a component of said signal and provides an output current corresponding to said component.

18. The electromagnetic wave processor of claim 14, wherein said independently controllable current sources are configured so that the fewest number of said independently controllable current sources will change when said signal changes.

19. The electromagnetic wave processor of claim 14, wherein said signal is a digital signal.

20. The electromagnetic wave processor of claim 14, wherein said signal is a binary number.

21. The electromagnetic wave processor of claim 14, wherein said signal is a seven bit binary number.

22. The electromagnetic wave processor of claim 14, wherein said independently controllable current sources comprise one or more transistors.

23. The electromagnetic wave processor of claim 14, wherein each of the plurality of independently controllable current sources are weighted and generate a particular output based on the weight.

24. The electromagnetic wave processor of claim 14 comprising an integrated circuit.

25. The electromagnetic wave processor of claim 24, wherein each of the plurality of independently controllable current sources comprises at least one of a transistor or a transistor segment.

26. An electromagnetic wave processor comprising:
a plurality of independently controllable current sources operatively connected for receiving a signal, with said independently controllable current sources being on or off in response to said signal, wherein each one of the independently controllable current sources generates an output when on, and with each of the outputs being combined to provide a processed electromagnetic wave, wherein said independently controllable current sources are regulated by at least one control component configured to switch on or off the one or more of said independently controllable current sources in a sequence regulated by a digital control word, and wherein a plurality of control components comprise a bias control network configured to control the biasing of said independently controllable current sources.

27. A method of processing an electromagnetic wave comprising the steps of: regulating a plurality of independently controllable current sources via a signal generated from a characteristic of an original input wave such that each of the independently controllable current sources is either on or off, wherein said signal has a plurality of signal components and wherein one or more of said independently controllable current sources is associated with a component in said signal, wherein each one of the independently controllable current sources generates an output when on, with each of the outputs being combined to provide a processed electromagnetic wave, and wherein the plurality of independently controllable current sources are switched on or off in a sequence regulated by a coded digital word.

28. The method of claim 27, wherein the characteristic of the original input wave is an amplitude characteristic.

29. The method of claim 27, wherein the signal is digital.

* * * * *